United States Patent [19]

Boyers

[11] Patent Number: 4,471,469
[45] Date of Patent: Sep. 11, 1984

[54] NEGATIVE RESISTANCE BUBBLE MEMORY AND DISPLAY DEVICE

[75] Inventor: David G. Boyers, Mountain View, Calif.

[73] Assignee: The Board of Trustees of the Leland Stanford Junior University, Stanford, Calif.

[21] Appl. No.: 435,682

[22] Filed: Oct. 18, 1982

Related U.S. Application Data

[63] Continuation of Ser. No. 390,689, Jun. 21, 1982.

[51] Int. Cl.³ .............................................. G11C 13/04
[52] U.S. Cl. ..................................... 365/116; 365/73; 365/159; 315/169.1; 313/586
[58] Field of Search ................. 365/73, 74, 116, 129, 365/159; 315/169.1, 169.4; 313/581, 586

[56] References Cited

U.S. PATENT DOCUMENTS

| | | | |
|---|---|---|---|
| 3,499,167 | 3/1970 | Baker | 365/116 |
| 3,559,190 | 1/1971 | Bitzer | 365/116 |
| 3,704,389 | 11/1972 | McClelland | 315/169.1 |
| 3,803,440 | 4/1974 | Andoh et al. | 313/586 |
| 3,811,062 | 5/1974 | Andoh et al. | 313/586 |
| 3,898,515 | 8/1975 | Andoh et al. | 313/586 |

Primary Examiner—Terrell W. Fears
Attorney, Agent, or Firm—Flehr, Hohbach, Test, Albritton & Herbert

[57] ABSTRACT

Disclosed is a memory or display device which includes a shift register having a bubble generator, a bubble propagator, and a bubble annihilator. Front and back glass plates are provided with dielectric-covered, transparent electrodes with the plates being positioned in spaced, parallel alignment. A suitable medium having a bilaterally symmetric V-J characteristic with a current controlled negative resistance region is provided between the plates and in contact with the dielectric covering the transparent electrodes. Bubbles are moved along an asymmetric track in the propagator by modulating voltage on two electrodes on opposing sides of the asymmetric track.

26 Claims, 31 Drawing Figures

POSITION ⟶     n    n+1

NEGATIVE RESISTANCE BUBBLE MEMORY AND DISPLAY DEVICE

The U.S. Government has rights in this invention pursuant to National Science Foundation Grant No. EDS-8014561.

This application is a continuation in part of co-pending application Ser. No. 390,689 filed June 21, 1982, by David Boyers for "Plasma Bubble Display and Memory Device."

This invention relates generally to display and memory devices and more particularly the invention relates to such devices which employ plasma bubbles.

Plasma displays are known which utilize small area glow discharges in a matrix-addressed or shift-addressed structure. The present invention is directed to display and memory structures which utilize plasma bubbles. The structures have dielectric covered electrodes with a media therebetween which exhibits a current-controlled negative resistance (CCNR) characteristic. A plasma domain is established by providing a peak current density $J_p$ (averaged over the electrode area) in the subnormal glow or negative resistance region of the media.

The divice behavior is similar to that of a magnetic bubble device. Changing the applied field changes the size and shape of the plasma domain. There is a range of applied fields over which a bubble domain exhibits a corresponding range of stable diameters, and the bubble domains are bistable.

The fundamental building block of the plasma bubble display is a plasma bubble shift register composed of a bubble generator, a bubble propagator, and a bubble annihilator. In a preferred embodiment the design of the propagator element is based on an analog to the "angel-fish" magnetic bubble propagation element. Periodic modulation of the applied voltage produces periodic modulation of the bubble area to thereby move the bubble along an asymmetric guiding track.

The bubble generator can be a nucleate-type or a mitosistype which produces a new bubble from a parent bubble. The annihilator comprises the last position of the shift register which is electrically isolated from the propagation section. A bubble is annihilated when the voltage on the annihilator electrode drops below the minimum sustaining level ($V_{Smn}$).

Accordingly, an object of the invention is a display and memory structure which utilizes plasma bubbles.

Another object of the invention is apparatus for producing current controlled negative resistance domains for memory and display applications.

A feature of the invention is a medium confined between dielectric covered electrode structures and having a bilaterally symmetric voltage-current density characteristic with a current controlled negative resistance region.

Another feature of the invention is asymmetric means for guiding plasma bubbles.

The invention and objects and features thereof will be more readily apparent and fully understood from the following description and appended claims when taken with the drawings, in which:

CONVENTIONAL AC PLASMA DISPLAY TECHNOLOGY

The conventional ac plasma display panel (ACPDP) produces an image from a planar array of small area glow discharges formed in the volumes defined by the intersections of two orthogonal sets of dielectric-covered line electrodes. The bistability of "C-discharges" formed between dielectric-covered electrodes gives the ac plasma display its important property of inherent memory. Currently, ACPDP's are of two types: (1) the matrix-addressed graphics/alphanumeric display, and (2) the shift-addressed alphanumeric display.

The matrix addressed display, invented at the University of Illinois in 1964, has a number of attractive features which have made it the principal competitor to the CRT for large area graphics and alphanumeric display applications. However, the high cost of the drive electronics makes the matrix display expensive. Efforts are being made to reduce this cost through the use of integrated drive electronics and improved panel design.

Figure 1A:
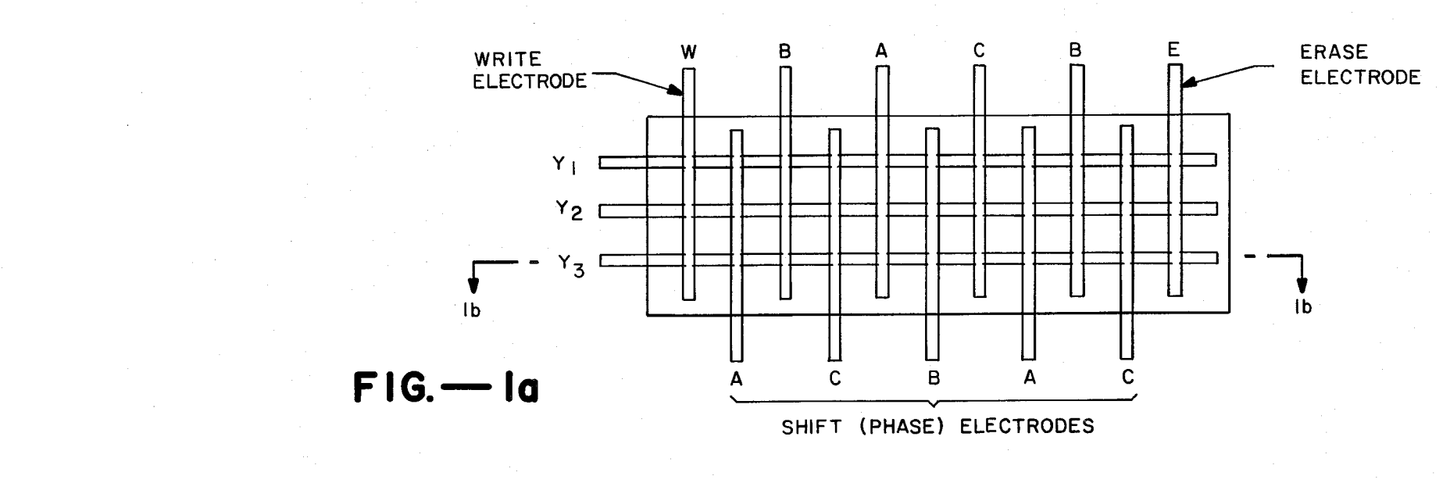
FIG. 1a and FIG. 1b are a top view and section view, respectively, of a shift-addressed ac plasma display panel.
Figure 1B:
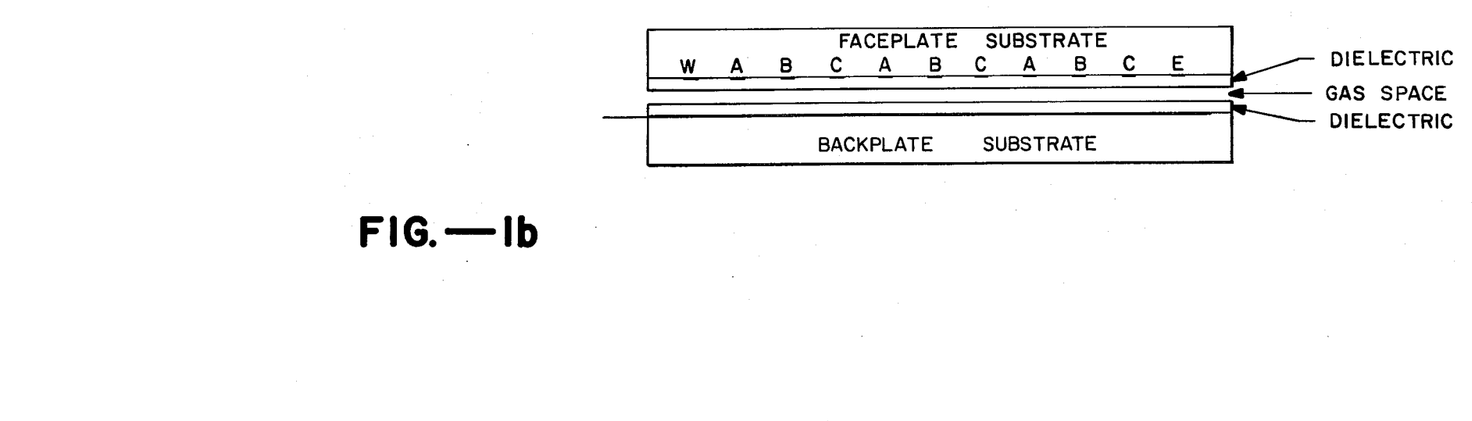
Figure 2A:
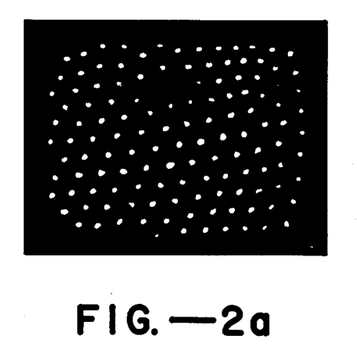
FIGS. 2a-2e are photographs of plasma domains.
Figure 2B:
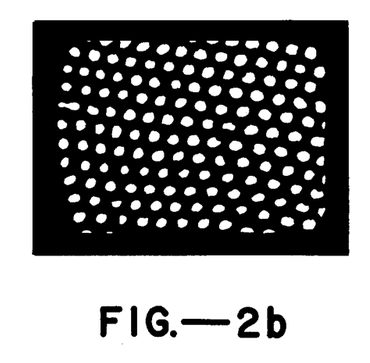
Figure 2C:
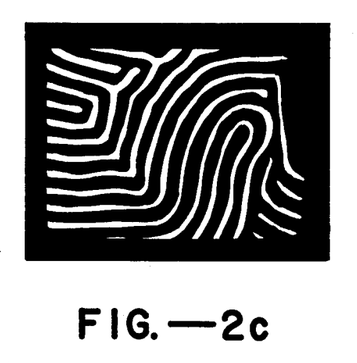
Figure 2D:
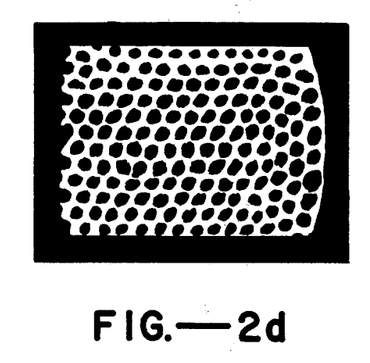
Figure 2E:
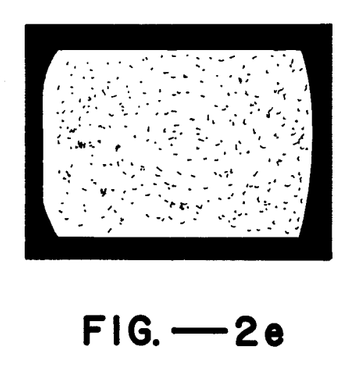
Figure 2F:
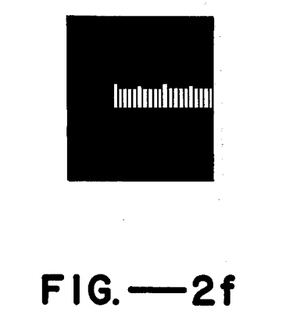
FIG. 2f is a scale therefor.

The shift-addressed alphanumeric display was developed as an alternative to the matrix-addressed display to further reduce the drive electronics cost. This design employs a gas/cathode composition, gas pressure, gap length, and sustain frequency similar to that of the matrix-addressed display. The principal difference lies in the method of addressing the picture elements. In this design, each horizontal display line is a shift register composed of three elements: a write electrode, a three or four phase shift electrode structure, and an erase electrode. FIG. 1A and FIG. 1B are a top view and a section view, respectively, of a shift-addressed ac plasma display panel.

Plasma Bubble Properties

Copending application, Ser. No. 390,689, supra, presents results on the discovery of plasma bubble domains (PBD's).

These domains occur as regular patterns of small area glow discharges formed under ac excitation in an inert gas based, atmospheric pressure gas mixture confined between large area, closely spaced, plane parallel, dielectric covered electrodes. Plasma bubble domains have properties which are analogous to those of magnetic bubble domains (MBD's). The plasma domain structure is composed of "glowing" and "non-glowing" regions, while the magnetic domain structure is composed of magnetization "up" and magnetization "down" regions. Plasma domains exhibit the following properties: (1) Changing the applied sustain voltage $V_s$ changes the size and shape of the domain that forms (bubble, stripe, etc). (2) There is a range of applied sustain voltages $V_{sbn} \leq V_s \leq V_{sbx}$ over which a bubble domain exhibits a corresponding range of stable diameters $D(V_{sbn}) \leq D \leq D(V_{sbx})$. (3) If $V_s$ is increased, then a bubble first grows in diameter, then elliptically distorts, then runs out into a stripe; if $V_s$ is deceased, then a stripe domain breaks up into a series of bubble domains. (4) Domains are bistable over a range of sustain voltages $V_{smn} \leq V_s \leq V_{smx}$. (5) Domains will move laterally to a position which maximizes $V_s - V_{smn}$.

The first and second properties, concerning the influence of applied voltage on domain size and shape are illustrated by the results shown in FIG. 2A–2E. There is a range of stable bubble diameters as the applied voltage is increased ($D_{max}/D_{min} \cong 1.4$, $D_{min} \cong 175$ $\mu$) (FIG. 2(a) and FIG. 2(b)). There is a transition from large bubble domains to stripe domains, as the voltage is increased further (FIG. 2(c)). There is a transition from stripes to hexagonally woven stripes (HWS), to a uniform glow, which occurs at even higher applied voltages (FIG. 2(d) and FIG. 2(e)). The stripe domains have a range of stable widths before they make the transition to the HWS domain pattern. The non-glowing regions of the HWS domain pattern form a hexagonal array of non-glowing bubbles which have a range of stable diameters prior to their collapse to a bright uniform glow. FIG. 5(f) shows a scale photographed under the same magnification. The smallest division is 100 $\mu$m.

These domains were formed using variable amplitude, 40 kHz, 0.4 $\mu$sec rise time, square wave excitation. A gas discharge was formed in a 50–60 $\mu$m gap between dielectric (Corning 0211 microsheet) covered electrodes enclosed in a flow purged gas cell with electrode diameter $D_e = 1.1$ cm, dielectric thickness $l_a = l_b = 76$ $\mu$m, and $\epsilon_a = \epsilon_b = 6.4$. The gap was flow purged with helium gas at 1 atm. (Similar results were obtained with a neon purge gas.) The inert gas formed a Penning mixture with a small percentage of ambient air which was inevitably present. Domains will not form in pure inert gas since bistability is a requirement for domain existence.

Figure 3A:
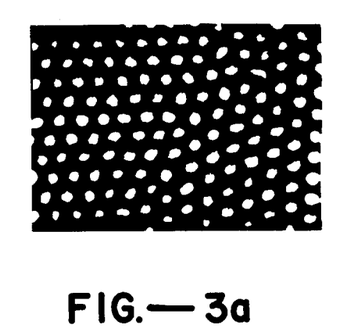
FIGS. 3a-3c are photographs illustrating the plasma bubble mitosis process.
Figure 3B:
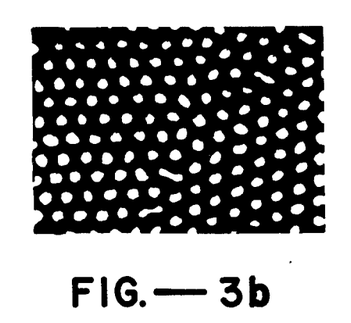
Figure 3C:
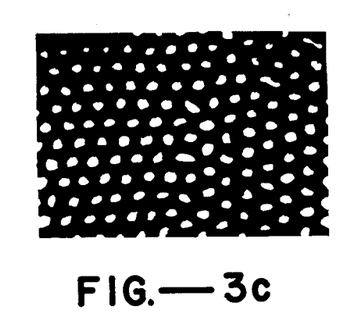

The third property, concerning the bubble→stripe and stripe→bubble transitions, is illustrated by the results shown in FIG. 3A–3C. The photographs are printed from individual frames of a 16 mm motion picture. FIG. 3(a) shows elliptically distorted bubbles. FIG. 3(b) shows short stripe domains approximately two bubble diameters long. FIG. 3(c) shows two bubble domains formed from the breakup (mitosis) of a short stripe domain.

The fourth property, concerning domain bistability, is illustrated by the following observations: (1) When conditions are unfavorable to domain formation, as in the case of pure neon gas or slow rising ac excitation, then only a dim uniform townsend discharge exhibiting no bistability forms. (2) When conditions are favorable for domain formation, then there is a range of applied sustain voltages over which the domains (bubble, stripe, etc.) can be sustained.

Figure 4:
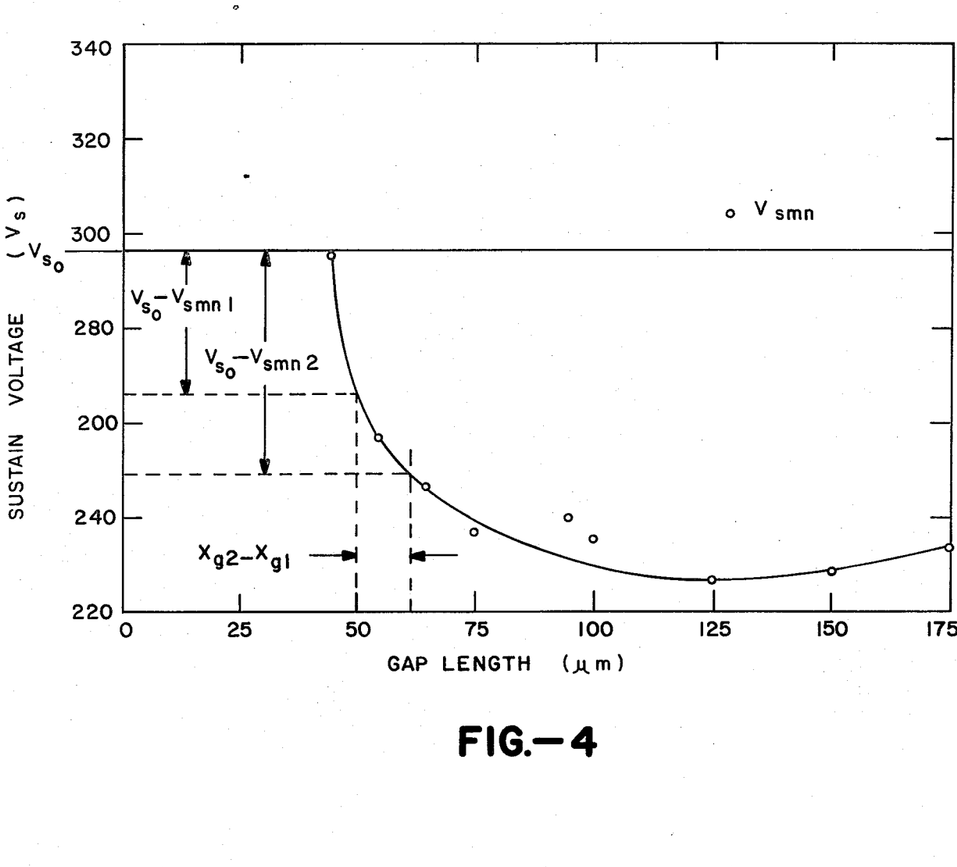
FIG. 4 is a plot of plasma sustaining voltage versus gap length for an atmospheric pressure C-discharge formed in helium based gas.

The fifth property, concerning lateral motion of domains, is illustrated by the following observations: (1) the increased applied sustain voltage $V_s$ causes an increased domain area; a domain residing in an applied field with a lateral gradient will expand its boundary most where $V_s$ is largest; accordingly, a domain will move laterally in the direction of largest $V_s$. (2) A domain will contract its boundary to achieve an optimum current density and lower maintaining voltage $V_m$ and a corresponding lower $V_{smn}$;[1,2] accordingly, a domain will move laterally in the direction of smallest $V_{smn}$. (3) Domains are formed between plane electrodes separated by a nomimal gap length $x_g \cong 50$ $\mu$m and covered by dielectric layers with a total air equivalent dielectric thickness of $x_t = 24$ $\mu$. When the electrodes are adjusted to produce a lateral gradient in gap length 50 $\mu$m $\leq x_g \leq 60$ $\mu$m, the domains move in the direction of largest gap length corresponding to smallest $V_{smn}$ (FIG. 4). When the gap length gradient is increased, the speed of domain movement increases.

In FIG. 4, $V_s$, $V_{smn} = f(x_g)$ for an atmospheric pressure C-discharge formed in a helium based gas mixture with 40 kHz, 0.4 $\mu$sec rise time, square wave excitation ($D_e = 1.11$ cm, $x_t = 24$ $\mu$m).

PLASMA BUBBLE DISPLAY DESIGN

In accordance with the present invention, plasma bubble domains form the picture elements of a plasma bubble display. Plasma bubble domains as picture elements are distinguished from conventional ac plasma display picture elements. In conventional displays, the size and shape of the small area gas discharges is defined by the orthogonal narrow-line electrode structure which produces localized regions of high field to initiate and sustain the discharge. In the proposed plasma bubble display, the size and shape of the domains formed between large area, featureless, plane parallel, dielectric-covered electrodes, is determined by basic physical phenomena and not by the electrode structure. The picture elements of the two displays are similar in that they both exhibit the property of bistability.

If plasma bubble domains are to form the picture elements of a display, then there must be a method of addressing them. An approach is suggested by the fact that plasma domains and magnetic domains exhibit a number of analogous properties. One promising plasma bubble display design employs a shift-addressing technique, exploiting this similarity, which is based on an analog to an early magnetic bubble field-access addressing scheme.

Shift Register Elements: Design and Operation

The fundamental building block of the plasma bubble display, in accordance with the invention, is a plasma bubble register composed of three elements: (1) a bubble generator, (2) a bubble propagator, and (3) a bubble annihilator. First discussed is the design operation of the bubble propagator. The bubble generator and bubble annihilator designs are based on the propagator design.

Figure 5A:
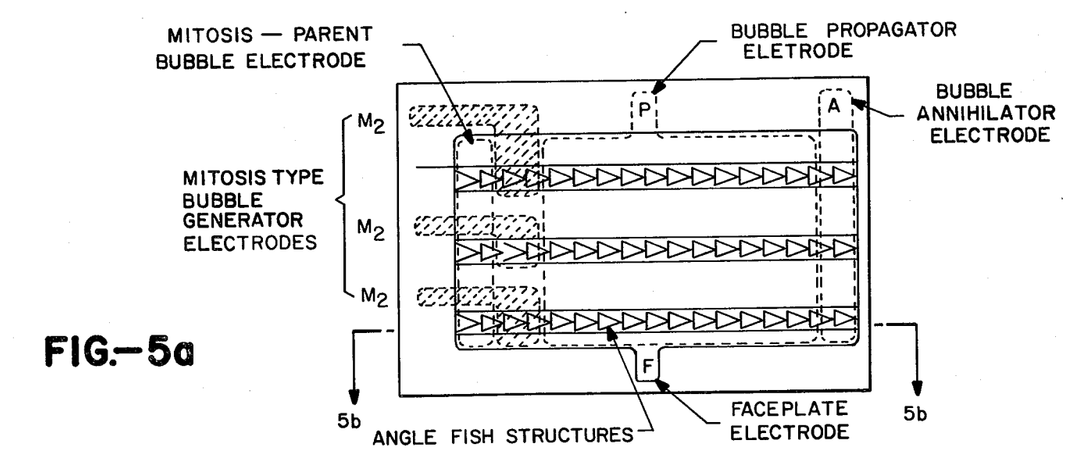
FIG. 5a and FIG. 5b are a top view and a section view respectively of a three shift register device in accordance with the invention.
Figure 5B:
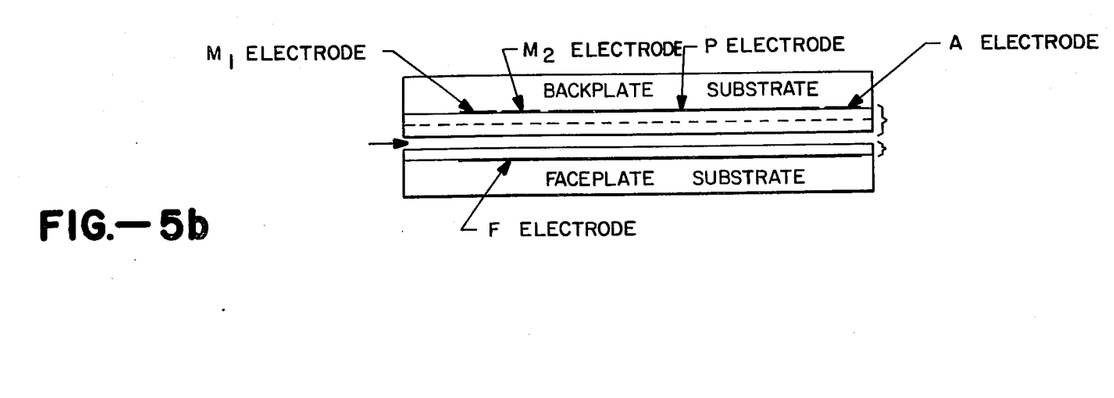

FIG. 5a and FIG. 5b are a top view and a section view, respectively, of three-shift registers. The device includes a glass face plate 10 and a glass back plate 12 in spaced parallel alignment. Transparent electrode structures such as tin oxide are formed on adjacent surfaces of the plates 10, 12 and the electrodes are covered by a dielectric material. The generators include a common electrode M1 and an individual electrode M2. The propagator includes a back plate electrode, P, and the annihilator includes an electrode, A, on the back plate.

The face plate electrode, F, is common to all three elements.

1. Bubble Propagator

Figure 6A:
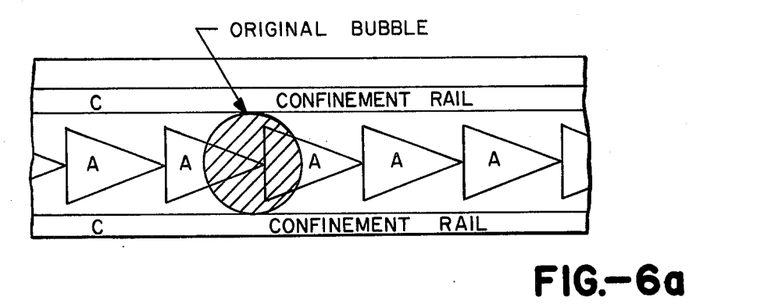
FIGS. 6a-6c illustrate a plasma bubble propagator in accordance with the invention.
Figure 6B:
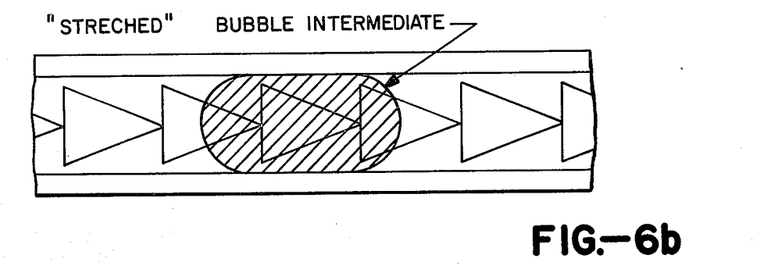
Figure 6C:
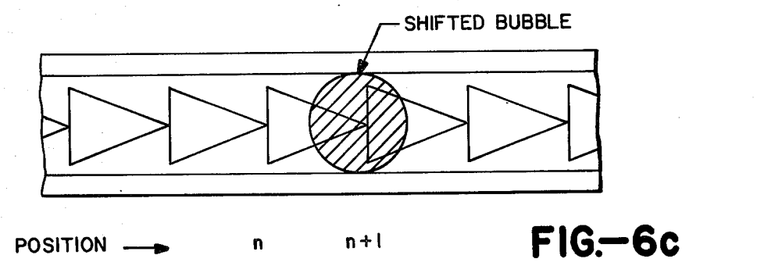

The design of the bubble propagator element is based on an analog to the "angelfish" magnetic bubble propagation element. Periodic modulation of the sustain voltage produces periodic modulation of the bubble area to move the bubble along an asymmetric guiding track comprising two parallel confinement rails inscribed with a sequence of isosoceles triangles ("angelfish") (FIG. 6(a)). The confinement rails restrict increases in bubble area to increases in length along the direction of propagation; the inscribed isosceles triangles produce a left-right asymmetry in the bubble expansion and contraction. The angelfish-type plasma bubble propagator element is illustrated in FIGS. 6a–6c as follows: (a) A bubble domain sustained at position n; regions A,B. and C are identified; (b) A bubble domain sustained at positions n→n+1; (c) A bubble domain sustained at position n+1.

The sustain voltage is modulated over a range $V_{snb} \leq V_s \leq V_{sbx}$ corresponding to a range of stable diameters $D(V_{sbn}) \leq D \leq D(V_{sbx})$ with $$V_{smn} < V_{sbn} \leq V_s \leq V_{sbx} < V_{smx} \tag{1}$$

where $V_{smn}$ and $V_{smx}$ define the bistable operating margin.

The confinement rails are separated by a distance $Y_c$ slightly less than or equal to the minimum bubble diameter $D(V_{sbn})$. Increasing $V_s$ to $V_{sbx}$ causes the bubble to increase its area, not through an increase in diameter as in the case of the free unconfined bubbles, but through an increase in length along the direction of propagation. The bubbles are confined to region B between the rails and prevented from expanding into region C (FIG. 6(a)) by insuring that $$V_s(C) - V_{smn}(C) < 0 < V_s(B) - V_{smn}(B) \tag{2}$$

This patterned variation of $V_s - V_{smn}$ insures that domains can be sustained in region B but cannot be sustained in region C.

The isosceles triangle height $h = Y_c$; the isoceles triangle base b is slightly less than or equal to $Y_c$. The isoceles triangle center-to-center separation is equal to h; the bubble pitch is $3h \cong 3Y_c \cong 3D(V_{sbn})$. The inscribed isosceles triangle structure takes the form of a patterned variation of $V_s - V_{smn}$ such that $$V_s(A) - V_{smn}(A) > V_s(B) - V_{smn}(B) \tag{3}$$

According to the third property, domains will seek regions with characteristics of A in preference to those with the characteristics of B.

If we combine Eq. (2) and Eq. (3), then we can write a general relationship for the three regions.

$$V_s(A) - V_{smn}(A) > V_s(B) - V_{smn}(B) > 0 > V_s(C) - V_{smn}(C) \tag{4}$$

There are four alternative embodiments of the confinement rail structure defined by Eq. (2) and four similar embodiments of the inscribed isosceles triangle structure defined by Eq. (3). In both structures, the first three alternative embodiments use no electrode patterning; accordingly, $$V_s(A) = V_s(B) = V_s(C) = V_s \tag{5}$$

Combining Eq. (4) and Eq. (5) yields $$V_{smn}(A) < V_{smn}(B) < V_s < V_{smn}(C) \tag{6}$$

The three alternative embodiments of Eq. (6) adjust the relative values of the secondary electron emission coefficient γ, the total air equivalent dielectric thickness $x_t = l_t/\epsilon$, or the gap length $x_g$ as follows:

(i) γ Variation: set $\gamma(A) > \gamma(B) > \gamma(C)$
where $$V_{smn} = f(\gamma)$$

(ii) $x_t$ Variation: set $x_t(A) < x_t(B) < x_t(C)$. This embodiment is practical only if $x_t \sim x_g$. If $x_t \sim x_g$, then changing $x_t$ produces an appreciable change in $V_{smn}$. If $x_t << x_g$, then changing $x_t$ produces a minimal change in $V_{smn}$.

(iii) $x_g$ Variation: set either $$x_g(A) > x_g(B) > x_g(C)$$

when $$dV_{smn}/dx_g < 0$$

or $$x_g(A) < x_g(B) < x_g(C)$$

when $$dV_{smn}/dx_g > 0$$

The fourth alternative embodiment of Eq. (6) uses electrode patterning and no variation of γ, $x_t$, or $x_g$ so that $$V_{smn}(A) = V_{smn}(B) = V_{smn}(C) = V_{smn} \tag{7}$$

Combining Eq. (4) and Eq. (7) yields $$V_s(A) > V_s(B) > V_{smn} > V_s(C) \tag{8}$$

The embodiment of Eq. (8) uses electrode patterning ($V_s$ variation). We will describe the embodiment of the confinement rail structure and the embodiment of the inscribed isoceles triangle structure, separately.

(iv) $V_s$ Variation:
  Confinement rail structure: The voltage $V_s(C)$ is reduced in region C by eliminating the faceplate (or backplate) electrode in that region.

Figure 7:
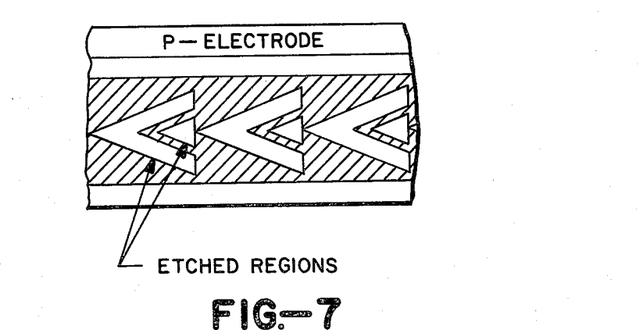
FIG. 7 is a top view of an alternative conductor etch pattern in a plasma bubble propagator.

Inscribed isosceles traingle structure: If the characteristics of regions A and B are related as described by Eq. (8), then the shift direction is from base to vertex. (This will be further explained in the next section.) If the characteristics of the two regions are reversed such that $$V_s(B) > V_s(A) > V_{smn} \tag{9}$$

then the shift direction will be from vertex to base. We can consider an embodiment of Eq. (9) in which the backplate electrode is etched to remove a portion of the conductor inside region A. This will reduce $V_s(A)$ relative to $V_s(B)$. The fringe field from the surrounding conductor in region B and the web conductor in region A prevents $V_s(A)$ from falling below $V_{smn}$ (FIG. 7). FIG. 7 illustrates a conductor etch pattern for the $V_s$ variation embodiment of the inscribed isosceles triange structure.

There has been described four different embodiments for the guide rail structure and four different embodiments for the inscribed isosceles triangle structure. The two structures need not be implemented using the same variation; it will often be preferable to implement each with a different variation, e.g. the guide rail structure can be implemented with electrode patterning ($V_s$ variation) and the inscribed isosceles triangle structure can be implemented with $x_g$ variation.

Shift operation is described by considering a bubble at its minimum area corresponding to $V_s = V_{sbn}$ (FIG. 6(a)). If $V_s = V_{sbx}$, then the bubble will increase its area by increasing in length (FIG. 6(b)). The bubble area is shown to be increased by approximately a factor of two which is equivalent to a free domain diameter increase by a factor of 1.414. When $V_s$ is reduced to $V_{sbn}$, the domain returns to its original area. Without the inscribed isosceles triangle variation in structural characteristics, the bubble returns to its original position; with the inscribed isosceles triangle variation in structural characteristics, the bubble moves to the right.

When the end boundary of a bubble domain moves to the right, off the vertex of one isosceles triangle onto the base of the next isosceles triangle, there is an abrupt increase in the area of the inscribed isosceles triangle covered by the domain. If the end boundary of a bubble domain were to move to the left, off the base of one isosceles triangle onto the vertex of the previous, there would be an abrupt decrease in the area of the isosceles triangle which is covered by the domain. Domains move to a position which maximizes the area inside the isosceles triangles and hence maximizes the area-averaged value of $V_s - V_{smn}$. Accordingly, the domain will increase its area by moving its right boundary to the right while holding its left boundary essentially fixed and will decrease its area by moving its left boundary to the right while holding the right boundary essentially fixed (FIG. 6(b) and FIG. 6(c)).

Periodic modulation of the sustain voltage produces an "inch-worm-like" shift motion of the domain along the asymmetric guiding track. The inscribed isosceles triangle structure produces a sawtooth variation in the area-averaged value of $V_s - V_{smn}$. Domains move easily up the inclined side of a sawtooth (move easily from vertex to base) and do not move in the opposite direction against the vertical side of a sawtooth (don't move from base to vertex). The sawtooth variation produces a "ratchet" effect.

There is an alternative embodiment of an asymmetric keeper structure which is equivalent to the angelfish structure. This structure uses the same confinement rail structure and an inscribed sawtooth variation in $V_s - V_{smn}$ (embodied in a sawtooth variation in $\gamma$, $x_g$, or $x_t$). Although this structure is equivalent in function, it is usually much more difficult to implement in practice. It requires a sawtooth shaped variation in the value of the particular parameter compared to just two values required for the angelfish scheme.

2. Bubble Generator

The function of the plasma bubble generator is the same as the function of the write electrode pair of the conventional shift-addressed ACPDP. We propose two schemes for designing a plasma bubble generator: (1) the bubble mitosis scheme and (2) the bubble nucleation scheme.

The bubble mitosis scheme is based on an analog to the bubble generation scheme used in magnetic bubble memory devices. Here, a new bubble is generated by "tearing-off" a portion of a continuously maintained "parent" bubble. In the case of the plasma bubble display, we propose to utilize the third plasma domain property.

Figure 8A:
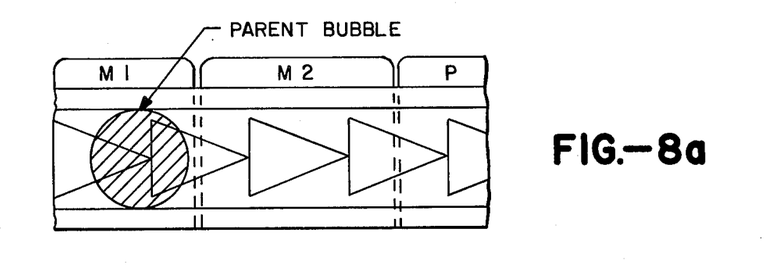
FIGS. 8a-8c illustrate a mitosis-type plasma bubble generator in accordance with the invention.

A bubble generator based on this phenomenon consists of a parent plasma bubble sustained at the mid-sustain voltage $V_{sbm}$ between two confining rails (which can be closed at the left end) inscribed with a sequence of isosceles triangles as shown in FIG. 8(a). The operating voltages are applied between the uniform faceplate electrode and the backplate electrode. The back plate is partitioned into three electrodes: generator electrodes $M_1$, and $M_2$ and an adjoining propagator electrode P.

Figure 8B:
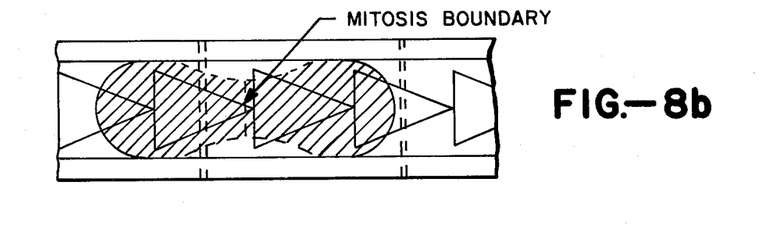
Figure 8C:
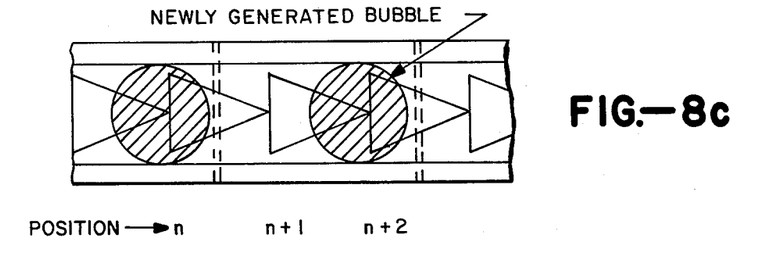

The voltage on $M_1$ and $M_2$ electrodes, spanning the first three bubble positions, is increased to the voltage for the bubble-to-stripe transition, $V_{sbs}$. The bubble increases in length, covering the three isosceles triangles at positions one through three (FIG. 8(b)). When the voltage on $M_1$ and $M_2$ is returned to $V_{sbm}$, the stripe undergoes a mitosis into two bubble domains at positions one and three (FIG. 8(c)). The mitosis process begins with a localized reduction in the width of the domain as shown by the dotted line in FIG. 8(b). The driving force for the mitosis is the reduction of surface loss. The newly generated bubble at position three is then shifted into the adjoining propagation section by modulating the voltage, $V_s$, on the $M_2$ and P electrodes in the range $V_{sbn}$ to $V_{sbx}$. The parent domain remains at position one for the next bubble generation.

The bubble nucleation scheme is a direct analog to the write scheme of the conventional ACPDP. A new discharge (bubble) is initiated (nucleated) at the write electrode (nucleate electrode) with initial current $I_o$ provided by an adjacent "keep-alive" electrode.

3. Bubble Annihilator

Figure 9A:
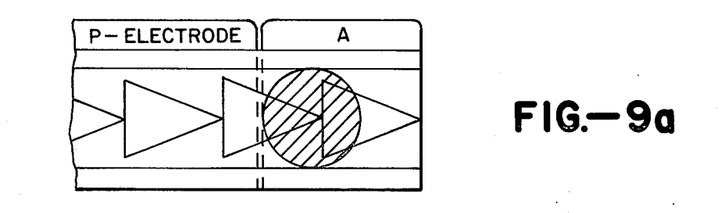
FIGS. 9a and 9b illustrate a plasma bubble annihilator in accordance with the invention.
Figure 9B:
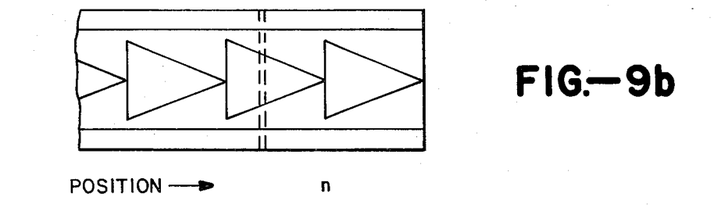
Figure 10A:
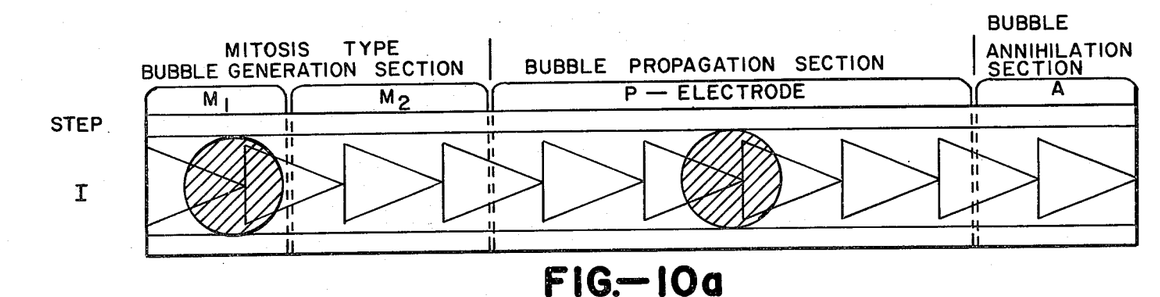
FIGS. 10a-10f illustrate operation of a device in accordance with the invention having a mitosis-type plasma bubble generator and shift register.
Figure 10B:
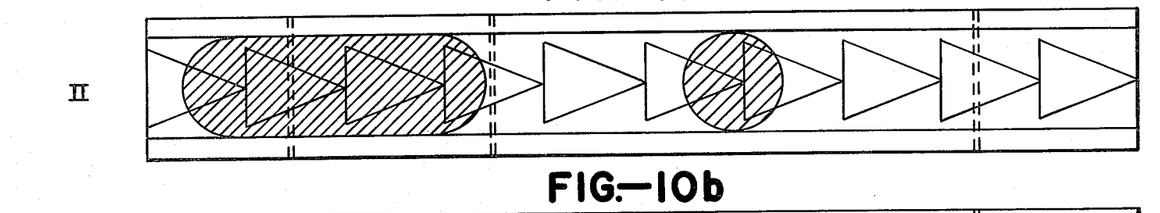
Figure 10C:
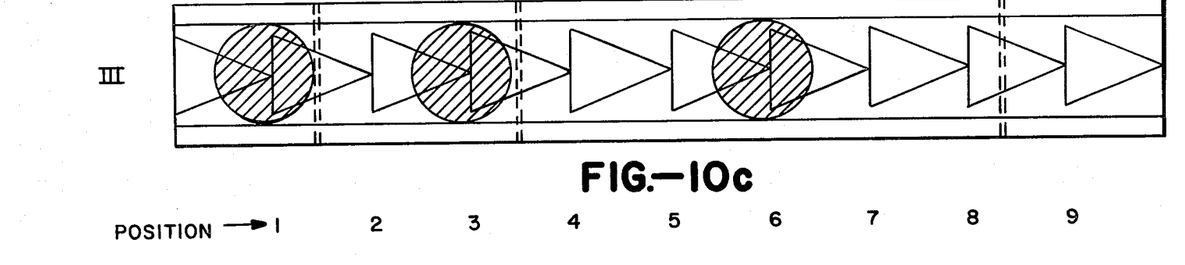
Figure 10D:
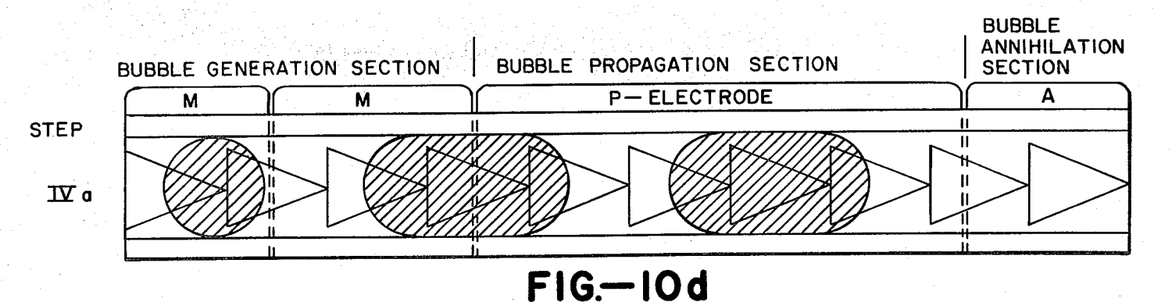
Figures 10E, 10F:
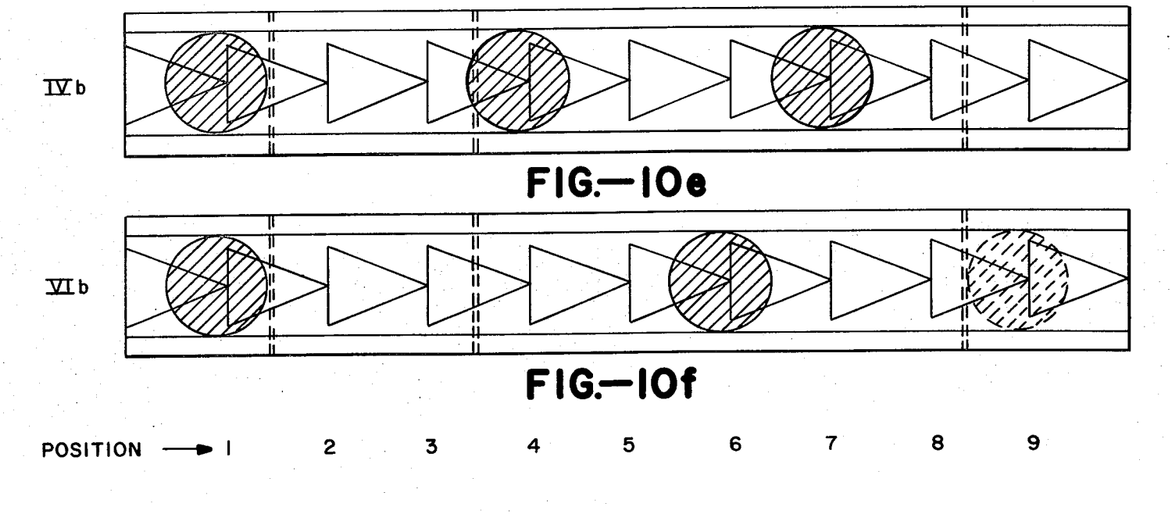

The function of the plasma bubble annihilator is directly analogous to the function of the erase electrode of the conventional shift addressed display. The last position of the shift register is isolated electrically from the adjacent propagation section (FIG. 9a-9b). Once the bubble reaches position n, it is annihilated when the voltage on A falls to $V_{sbe} < V_{smn}$.

B. Shift Register: Design and Operation

The mitosis-type-generator based shift register is shown schematically in FIG. 10a-10f. The bubble generator, bubble propagator, and bubble annihilator structures and electrode boundaries are shown in top view. The basic panel structure has a clear uniform faceplate electrode F, and a clear backplate partitioned into several electrodes. The generator, propagator, and annihilator structures are typically fabricated on the backplate. A single mitosis-type register has an $M_1$, $M_2$, P, A, and faceplate electrode. A single nucleate-type register has a K, N, P, A, and faceplate electrode. The separations between the $M_1$, $M_2$, P, and A electrodes are made as small as possible to minimize the break in field uniformity; the boundaries between these electrodes are located between bubbles for $V_s = V_{sbn}$. The nominal gap length $x_g$, air equivalent dielectric thickness $x_t$, gas pressure p, gas/cathode composition and excitation conditions are chosen appropriate for domain existence. One representative set is as follows: $x_g = 50$ μm, $x_t = 24$ μm, $\epsilon = 6.4$, $p = 600$ torr, Ne+1%→5%N$_2$, $f = 25 \to 150$ kHz, 0.4 rise time, square wave excitation.

The coordinated operation of the shift register is best explained in a step by step manner. The positions of the bubbles and the voltages applied between the backplate electrodes $M_1$, $M_2$, P, A and the faceplate electrode for each step of shift operation are summarized in Table 1. The positions of the bubbles at selected steps are shown in FIG. 10. The voltages for loading and "one" or "zero" are indicated in the table. The voltages, designated by the value of i for $V_{sbi}$, are defined at the bottom of the table. The voltages are modulated after each full cycle.

increased addressing time.) The number of external electrode connections to single and multiple line alphanumeric plasma bubble displays will follow these rules:
1. the faceplate electrode F is common to all registers,
2. all P electrodes can be tied in common for all registers,
3. all K or $M_1$ electrodes can be tied in common for all registers,
4. all A electrodes can be tied in common for all registers, and
5. the N or $M_2$ electrodes are separate to each individually addressable register.

The plasma bubble display can be organized in several different ways. Let us consider two of the most

TABLE 1

Load sequence for a mitosis-type plasma bubble shift register: electrode voltages and bubble positions

| Operation | Step | FIG. 10 | parent bubble | newly generated bubble | previously loaded bubble | $M_1$ | $M_2$ | P | A |
|---|---|---|---|---|---|---|---|---|---|
| generate | I | a | 1 | | 6 | m | m | m | e |
| 1/0 | II | b | 1→3/1 | | 6 | s/m | s/m | m | x |
|  | III | c | 1 | 3 | 6 | m | m | m | e |
| shift | IVa | d | 1 | 3→4 | 6→7 | m | x | x | x |
|  | IVb | e | 1 | 4 | 7 | m | n | n | e |
| shift | Va |  | 1 | 4→5 | 7→8 | m | x | x | x |
|  | Vb |  | 1 | 5 | 8 | m | n | n | e |
| shift & | VIa |  | 1 | 5→6 | 8→9 | m | x | x | x |
| annihilate | VIb | f | 1 | | 6 | m | n | n | e |

Legend:
$V_{sbn}$ = minimum operating voltage
$V_{sbx}$ = maximum operating voltage
$V_{sbs}$ = bubble → stripe voltage > $V_{smx}$
$V_{sbm}$ = mid operating voltage = $(V_{sbx} + V_{sbn})/2$
$V_{sbe}$ = erase voltage < $V_{smn}$ Step 1 begins with the parent bubble at position one and a previously loaded bubble at position six. Once the bubble reaches the last position of the register, as Step VIb, (position nine) it is annihilated and hence is shown with broken lines on FIG. 10(f).

The nucleate-type-generator-based bubble shift register operation is similar and described in co-pending application, Ser. No. 390,689, supra.

C. Bubble Display: Design and Operation

Figure 11:
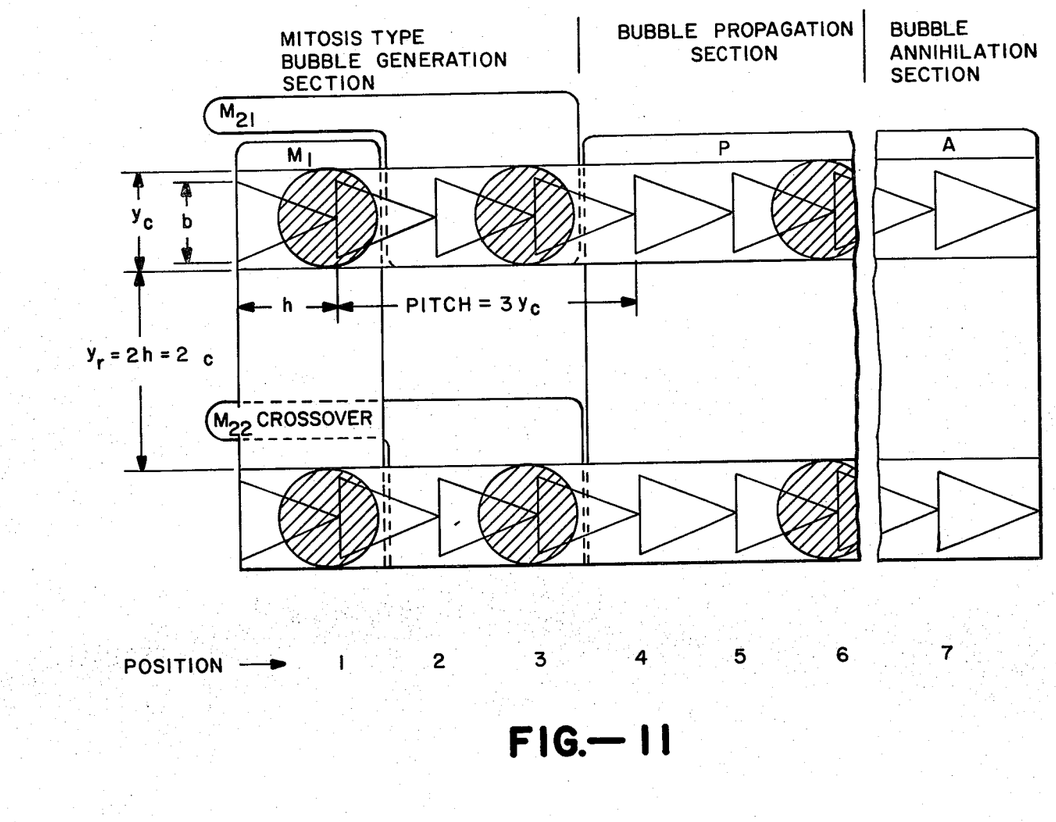
FIG. 11 is a plan view illustrating a multiple plasma shift register in accordance with the invention.

The plasma bubble shift register is the basic building block of single line and multiple line alphanumeric displays. A single line of (7×9) format characters with 3 decenders and a cursor line requires an (8×12) field and 13 parallel shift registers. If $D(V_{sbn}) \sim Y_c \simeq 175$ μm, then the horizontal bubble pitch $3Y_c$ will be 425 μm (equivalent to ~60 pels/in). The rail width $Y_w$ may occupy half the distance $Y_r$ between parallel registers ($Y_w = Y_r/2$); the center-to-center separation between parallel registers is $3Y_c$ and the rail-to-rail separation $Y_r = 2Y_c$ (see FIG. 11). Accordingly, the vertical and horizontal pitch are equal.

During shift operation the sustain voltage is modulated every cycle; each shift in position requires two sustain cycles of period T and each pel shift requires three position shifts. Accordingly, the shift time is 6T and the shift speed is 1/6T pels/sec. If f=50 Khz, then T=20 μsec and the shift speed is 8333 pels/sec. This is equivalent to a 5×7 and 7×9 character shift speed of 1388 and 1041 chars./sec, respectively. (The character field widths are six and eight, respectively.)

One of the principle advantages of all shift-addressing schemes is the reduction in the number of external connections to the panel and the corresponding reduction in the number of drivers. (This is balanced against an interesting configurations. In each case we will calculate the number of external connections and the panel load time for one or more lines of 80×9 characters with an 8×12 character field and a single cursor line.

A panel of n individually addressable registers requires n+4 connections; a single picture element shift requires 6/f secs where f is the sustain frequency. Accordingly, a single line of characters with cursors requires 17 connections and 76.8 msec to load at 50 kHz. Eight lines of characters (640 chars.) with cursors requires 108 connections and 76.8 msec to load at 50 kHz. These results are summarized in Table 2 where we've also considered the case of 32 lines of characters (2560 chars.) and compared the results to the matrix addressed panel with a (8×14) character field.

Figure 12:
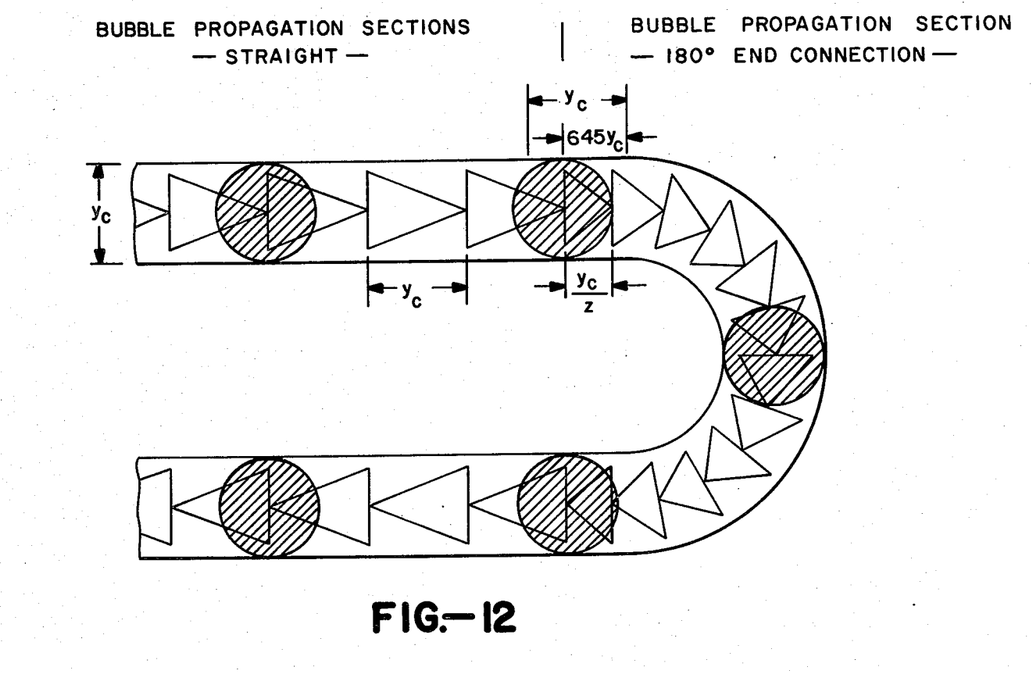
FIG. 12 is a plan view illustrating a one-hundred-eighty degree bubble propagator section layout in accordance with an embodiment of the invention.

It is well known that the relative reduction in the number of external connections for a shift addressed display is greatest for panels with a high aspect ratio (compare the number of connections for the bubble shift panel and the matrix panel for eight lines of characters to that for thirty-two lines of characters). This brings us to the second of the two display configurations. Here, the equivalent panel aspect ratio can be increased by addressing a line of characters with a single bubble generator at the input of the first register and a single bubble annihilator at the output of the twelfth register. (The cursor line is addressed separately.) The twelve registers are linked with 180 degree end connections (FIG. 12); the angelfish pattern is oriented for the odd numbered registers to shift right and for the even numbered to shift left. Accordingly, a line of characters is loaded as one long shift register. Here, 8 lines of characters (640 chars.) require 20 connections and 0.924 secs and 0.308 secs to load at 50 kHz and 150 kHz, respectively. These results, together with the results for 32 lines of characters are summarized in Table 2.

TABLE 2

External Connection and Load Time Requirements for Multiline Displays of 80 (7 × 9) Characters with a 8 × 12 Character Field and Single Cursor Line

| Addressing Configuration | External Connections | | Load Time | |
|---|---|---|---|---|
| | 8 Line Display (640 Chars.) | 32 Line Display (2560 Chars.) | 50 kHz | 150 kHz |
| Matrix (8 × 14 field including cursor) | 752 (112 × 640) | 1088 (448 × 640) | 80 μS | 26.7 μS |
| Bubble shift (Addressable registers) | 108 | 420 | 76.8 mS | 25.6 mS |
| Bubble shift (addressable character lines - 12 linked registers) | 20 | 68 | 0.924 S | 0.308 S |
| Bubble shift (addressable character lines - 12 linked registers - no cursor) | 12 | 36 | 0.924 S | 0.308 S |

SUMMARY

There has been described a novel current-controlled negative resistance (CCNR) medium bubble device such as a shift register memory or a display employing plasma bubbles. The display is similar in operation to a magnetic bubble device. Front and back glass plates are provided with dielectric-covered, transparent electrodes with the plates being positioned in spaced, parallel alignment. A suitable medium having a bilaterally symmetric V-J characteristic with a current-controlled negative resistance region is provided between the plates and in contact with the dielectric covering the transparent electrodes.

The display device includes a plasma bubble generator (either mitosis-type or nucleate type), a plasma bubble propagator, and a plasma bubble annihilator. The memory device is a closed loop shift register with a bubble detector. The propagator may comprise an asymmetric keeper structure such as an "angelfish" pattern or sequence of isosceles triangles between bubble-confining rails to propagate the bubbles in response to modulation of the plasma sustaining voltages across the front and back plate electrodes. Definition of the rails and sequence of triangles can be accomplished by variation in the dielectric material, spacing between plates, etching the electrodes for the required pattern, or dielectric thickness. Operation of a multiple plasma shift register display is given.

While the invention has been described with reference to specific embodiments, the description is illustrative of the invention and is not to be construed as limiting the invention. Various modifications and applications may occur to those skilled in the art without departing from the true spirit and scope of the invention, as defined by the appended claims.

What is claimed is:

1. A current-controlled negative resistance (CCNR) medium bubble device comprising:
    a planar faceplate, a planar backplate, said plates being supported in parallel spaced alignment,
    an electrode structure on a surface of said faceplate and an electrode structure on a surface of said backplate, said surfaces being adjacent,
    dielectric material covering said electrode structures,
    a CCNR medium between said plates and in contact with said dielectric material, said medium having a bilaterally symmetric voltage-current density characteristic with a current-controlled negative resistance region, said dielectric and medium exhibiting bistability,
    at least one asymmetric guide track for bubbles provided between said plates,
    said electrode structures including a common electrode on a face of one plate and a plurality of electrodes on a face of said other plate, said electrodes defining a bubble generator, one of said plurality of electrodes and said common electrode being cooperatively arranged with said asymmetric guide track for propagating bubbles from said bubble generator.

2. The bubble device as defined by claim 1 wherein said bubble generator comprises said common electrode on said one plate and first and second generator electrodes on said other plate.

3. The bubble device as defined by claim 1 wherein said bubble annihilator comprises said common electrode on said one plate and a first annihilator electrode on said other plate.

4. The bubble device as defined by claim 1 wherein said asymmetric guide track comprises two bubble-confining rails and a sequence of asymmetric patterns between said two rails.

5. The bubble device as defined by claim 4 wherein said asymmetric patterns comprise triangles.

6. The bubble device as defined by claim 4 wherein said asymmetric pattern and is defined by thickness of said CCNR medium.

7. The bubble device as defined by claim 4 wherein said asymmetric pattern is defined by the secondary electron emission coefficient of said dielectric material covering at least one electrode.

8. The bubble device as defined by claim 4 wherein said asymmetric pattern is defined by thickness of dielectric material covering at least one electrode.

9. The bubble device as defined by claim 4 wherein said asymmetric pattern is defined in electrode pattern of at least one electrode.

10. The bubble device as defined by claim 4 wherein said rails are defined by thickness of said CCNR medium.

11. The bubble device as defined by claim 4 wherein said rails are defined by the secondary electron emission coefficient of said dielectric material covering at least one electrode.

12. The bubble device as defined by claim 4 wherein said rails are defined by thickness of dielectric material covering at least one electrode.

13. The bubble device as defined by claim 4 wherein said rails are defined in electrode pattern of at least one electrode.

14. The bubble device as defined by claim 1 and further including a plurality of bubble generators, bubble annihilators and asymmetric guide tracks therebetween.

15. The bubble device as defined by claim 14 wherein said bubble generators have a common generator electrode on said other plate for maintaining bubbles and each generator has an individual electrode on said other plate for selective mitosis generation of a bubble for introduction to an associated asymmetric guide track.

16. The bubble device as defined by claim 14 wherein said plurality of asymmetric guide tracks have a common propagator electrode on said other plate.

17. The bubble device as defined by claim 14 wherein said plurality of bubble annihilators have a common annihilator electrode on said other plate.

18. The bubble device as defined by claim 1 wherein said medium comprises a gas mixture and said bubbles are plasma bubbles and said device comprises a display.

19. The bubble device as defined by claim 1 wherein said medium comprises a wide-band metal oxide insulator.

20. The bubble device as defined by claim 1 wherein said medium comprises an amorphous semiconductor.

21. The bubble device as defined by claim 1 wherein said amorphous semiconductor is a transition metal oxide.

22. The bubble device as defined by claim 1 wherein said amorphous semiconductor is a chalcogenide glass.

23. The bubble device as defined by claim 1 wherein said electrode structures are transparent.

24. The bubble device as defined by claim 1 wherein said bubble generator, said asymmetric guide track, and said bubble annihilator comprise a closed loop shift register and said device functions as a memory.

25. The bubble device as defined by claim 1 wherein said bubble generator, said asymmetric guide track, and said bubble annihilator comprise a shift register for a display.

26. The bubble device as defined by claim 1 and further including an ac voltage means and means connecting said ac voltage means to said electrode structures for generating bubbles, propagating bubbles, and annihilating bubbles.

* * * * *